United States Patent
You et al.

(10) Patent No.: US 12,227,838 B2
(45) Date of Patent: Feb. 18, 2025

(54) SUBSTRATE PROCESSING APPARATUS AND SUBSTRATE PROCESSING METHOD USING SAME

(71) Applicant: SEMES CO., LTD., Chungcheongnam-do (KR)

(72) Inventors: Ban Seok You, Seoul (KR); Woo Seok Jang, Gyeonggi-do (KR); Min Jung Choi, Gyeonggi-do (KR); Ki Duk Tak, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 99 days.

(21) Appl. No.: 17/886,474

(22) Filed: Aug. 12, 2022

(65) Prior Publication Data

US 2023/0160061 A1 May 25, 2023

(30) Foreign Application Priority Data

Nov. 25, 2021 (KR) .......................... 10-2021-0163880

(51) Int. Cl.
*C23C 16/24* (2006.01)
*C23C 16/44* (2006.01)
*C23C 16/455* (2006.01)
*H01J 37/32* (2006.01)

(52) U.S. Cl.
CPC .... *C23C 16/4405* (2013.01); *C23C 16/45565* (2013.01); *H01J 37/32532* (2013.01)

(58) Field of Classification Search
None
See application file for complete search history.

(56) References Cited

U.S. PATENT DOCUMENTS

| | | |
|---|---|---|
| 6,274,058 B1 | 8/2001 | Rajagopalan et al. |
| 2008/0035170 A1 | 2/2008 | Baek et al. |
| 2008/0236750 A1 | 10/2008 | Koshimizu |
| 2012/0006351 A1 | 1/2012 | Jun et al. |

(Continued)

FOREIGN PATENT DOCUMENTS

| | | |
|---|---|---|
| JP | 2001-85418 | 3/2001 |
| JP | 2008-244103 | 10/2008 |
| KR | 10-0785443 | 12/2007 |

(Continued)

OTHER PUBLICATIONS

Google Patents translation of JP2008244103A (Year: 2023).*

(Continued)

*Primary Examiner* — Eric W Golightly
(74) *Attorney, Agent, or Firm* — WOMBLE BOND DICKINSON (US) LLP

(57) ABSTRACT

A method of processing a substrate is provided. The method processes a substrate by using a substrate processing apparatus including a chamber, a shower head unit for supplying a cleaning gas into the chamber, a first electrode disposed on an upper portion of the shower head unit, a support unit for supporting the substrate, and a second electrode disposed inside the support unit, the method including supplying the cleaning gas into the chamber, and supplying a voltage of a first magnitude to the first electrode and supplying a voltage of a second magnitude greater than the first magnitude to the second electrode.

4 Claims, 8 Drawing Sheets

(56) References Cited

U.S. PATENT DOCUMENTS

2012/0145186 A1    6/2012   Koshimizu

FOREIGN PATENT DOCUMENTS

| KR | 10-2011-0040950 | 4/2011 |
| KR | 10-2012-0004190 | 1/2012 |
| KR | 10-2012-0089446 | 8/2012 |
| KR | 10-1577782 | 12/2015 |

OTHER PUBLICATIONS

Office Action dated Jun. 29, 2023 for Korean Patent Application No. 10-2021-0163880 and its English translation from Global Dossier. 19 pages.

* cited by examiner

RELATED ART

SUBSTRATE PROCESSING APPARATUS AND SUBSTRATE PROCESSING METHOD USING SAME

CROSS-REFERENCE TO RELATED APPLICATION

This application claims priority from Korean Patent Application No. 10-2021-0163880 filed on Nov. 25, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate processing apparatus and a substrate processing method using the same. More particularly, the present disclosure relates to a substrate processing apparatus for processing a substrate by using plasma and a substrate processing method using the substrate processing apparatus.

2. Description of the Related Art

A semiconductor device may be manufactured by forming a predetermined pattern on a substrate. When forming a predetermined pattern on a substrate, a plurality of processes may be continuously performed such as a deposition process, a lithography process, and an etching process in equipment used for a semiconductor manufacturing process.

A cleaning process may be performed when manufacturing a semiconductor device to remove residues remaining on a surface of a substrate, e.g., a wafer after processing the same. This cleaning process may be performed in a plasma reaction chamber in a dry clean manner after the etching process is performed.

However, when a shower head in the plasma reaction chamber is exposed to plasma, metal contamination may occur in the shower head unit at its holes.

SUMMARY

Aspects of the present disclosure provide a substrate processing method capable of preventing metal contamination by plasma generated in the process space by providing a lower electrode arranged internally of a support unit with a voltage set to be greater in magnitude than a voltage applied to an upper electrode arranged above the shower head unit.

Another aspect of the present disclosure provides a substrate processing apparatus capable of preventing metal contamination by plasma generated in the process space by providing a lower electrode arranged internally of a support unit with a voltage set to be greater in magnitude than a voltage applied to an upper electrode arranged above the shower head unit.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a method of processing a substrate by using a substrate processing apparatus including a chamber, a shower head unit for supplying a cleaning gas into the chamber, a first electrode disposed on an upper portion of the shower head unit, a support unit for supporting the substrate, and a second electrode disposed inside the support unit, the method including supplying the cleaning gas into the chamber, and supplying a voltage of a first magnitude to the first electrode and supplying a voltage of a second magnitude greater than the first magnitude to the second electrode.

The method of processing a substrate may further include, before the supplying of the cleaning gas into the chamber, seating the substrate on the support unit.

The cleaning gas may include Ar.

The cleaning gas may include $CF_4$.

The cleaning gas may include $O_2$.

The cleaning gas may include Ar, $CF_4$, and $O_2$, wherein Ar may have a flow rate greater than a flow rate of $CF_4$ and a flow rate of $O_2$.

The method of processing a substrate may further include providing a source power to the first electrode, and providing a bias power to the second electrode.

According to another aspect of the present disclosure, there is provided a method of processing a substrate by a substrate processing apparatus including a chamber, a first electrode disposed on an upper internal side of the chamber, and a second electrode disposed below the first electrode, the method including supplying a cleaning gas into the chamber, forming plasma by providing a source power of a first magnitude to the first electrode and a bias power of a second magnitude greater than the first magnitude to the second electrode, and removing contaminants on the upper internal side of the chamber by using the plasma.

The substrate processing apparatus may further include a shower head unit configured to supply the cleaning gas into the chamber, and a support unit configured to support the substrate The method of processing a substrate may further include, before the supplying of the cleaning gas into the chamber, seating the substrate on the support unit.

The cleaning gas may include Ar.

The cleaning gas may include $CF_4$.

The cleaning gas may include $O_2$.

The cleaning gas may include Ar, $CF_4$, and $O_2$, wherein Ar may have a flow rate greater than a flow rate of $CF_4$ and a flow rate of $O_2$.

The method of processing a substrate may further include providing a power of 1500 W to the first electrode, and providing a power of 2000 W to the second electrode.

According to yet another aspect of the present disclosure, there is provided an apparatus for processing a substrate, including a first electrode disposed on a shower head unit for supplying a cleaning gas into a chamber, a second electrode disposed inside a support unit for supporting the substrate, and a first power supply configured to provide a first voltage to the first electrode, and a second power supply configured to provide a second voltage to the second electrode, wherein the first voltage is greater in magnitude than the second voltage. The cleaning gas may include Ar.

The cleaning gas may include $CF_4$.

The cleaning gas may include $O_2$.

The cleaning gas may include Ar, $CF_4$, and $O_2$, wherein Ar may have a flow rate greater than a flow rate of $CF_4$ and a flow rate of $O_2$.

The first power supply may provide a source power of 1500 W to the first electrode, and the second power supply may provide a bias power of 2000 W to the second electrode.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
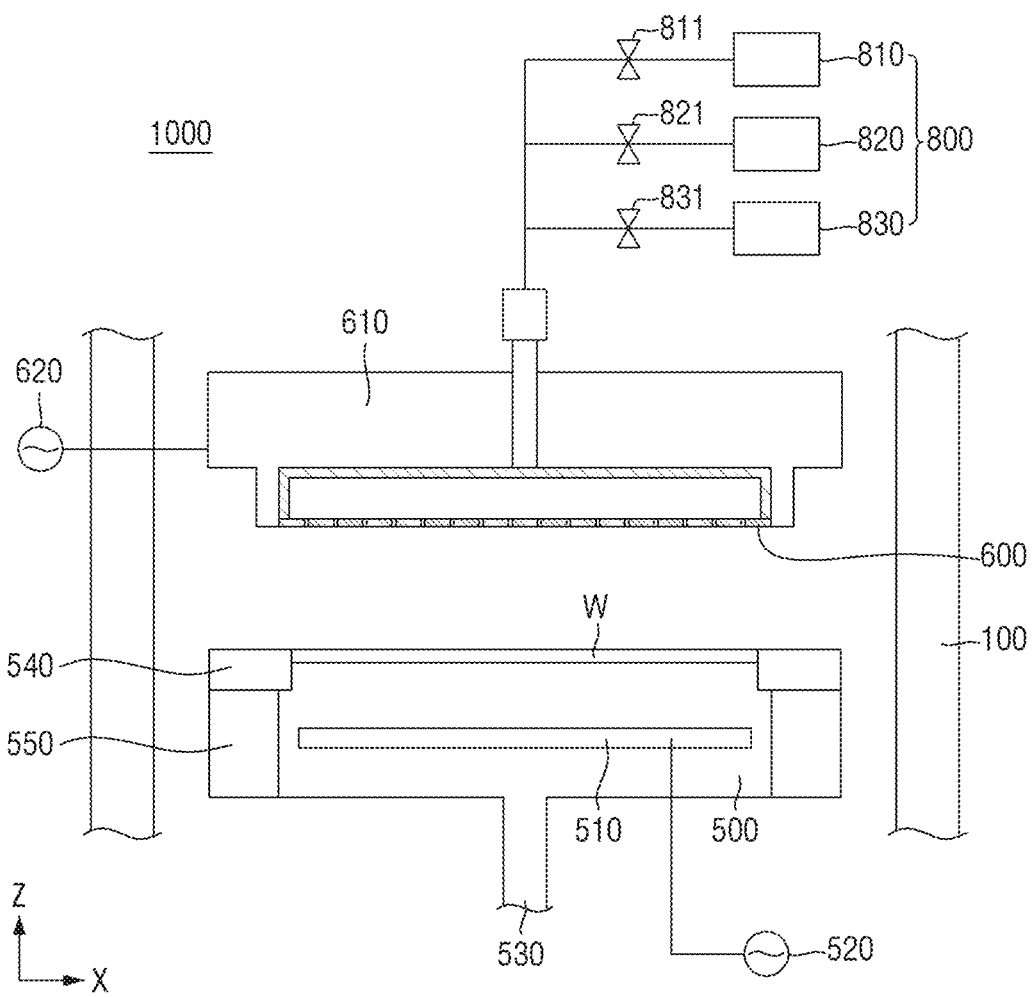
FIG. 1 is a schematic diagram of a substrate processing apparatus according to some embodiments of the present disclosure.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. Like reference numerals refer to like elements throughout the specification.

It will also be understood that when an element or a layer is referred to as being "on" another element or layer, it can be not only directly on the other element or layer, but also indirectly thereon with intervening elements or layers being present. In contrast, when an element is referred to as being "directly on" another element, there are no intervening elements present.

Spatially relative terms, such as "below," "beneath," "lower," "above." "upper." and the like, may be used herein for ease of description to convey one element's or feature's relationship to another element(s) or feature(s) as illustrated in the drawings. It will be understood that the spatially relative terms are intended to encompass different orientations of the device in use or operation in addition to the orientation depicted in the drawings. For example, when a device in the drawings is turned over, elements described as "below" or "beneath" other elements or features would then be oriented "above" the other elements or features. Thus, the illustrative term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, components, and/or sections, these elements, components, and/or sections should not be limited by these terms. These terms are only used to distinguish one element, component, or section from another element, component, or section. Thus, a first element, first component, or first section discussed below could be termed a second element, second component, or second section without departing from the teachings of the present disclosure.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including." when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some embodiments of the present disclosure will be described in detail with reference to the accompanying drawings. In the following description, like reference numerals designate like elements, although the elements are shown in different drawings. Further, in the following description of some embodiments, a detailed description of related known components and functions when considered to obscure the subject of the present disclosure will be omitted for the purpose of clarity and for brevity.

Figure 2:
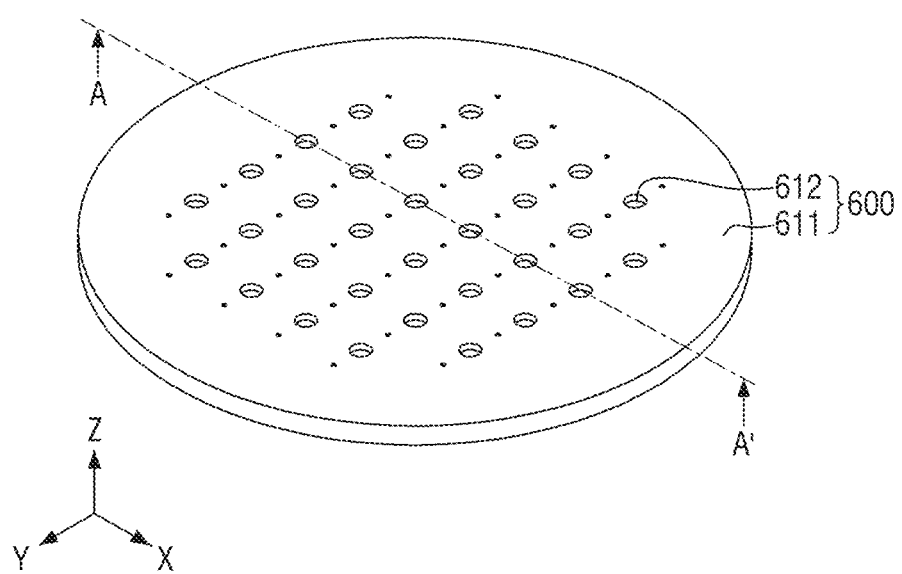
FIG. 2 is a schematic diagram of a shower head unit of a substrate processing apparatus according to some embodiments of the present disclosure.
Figure 3:
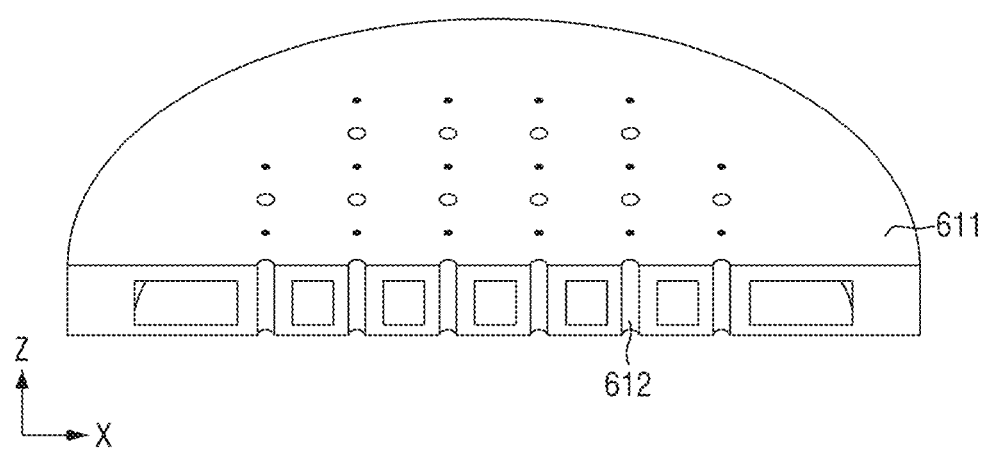
FIG. 3 is a view showing a cross-section taken along the line A-A' of FIG. 2.

FIG. 1 is a schematic diagram of a substrate processing apparatus 1000 according to some embodiments of the present disclosure. FIG. 2 is a schematic diagram of a shower head unit 600 of a substrate processing apparatus according to some embodiments of the present disclosure. FIG. 3 is a view showing a cross-section taken along the line A-A' of FIG. 2.

Referring to FIG. 1, the substrate processing apparatus 1000 may include a first electrode 610, a second electrode 510, a first power source 620, and a second power source 520.

The chamber 100 refers to an internal space where a plasma process is performed. The plasma process may include, for example, but is not limited to, etching, ashing, ion implantation, thin film deposition, cleaning, etc. The chamber 100 may be, for example, a cylindrical vacuum chamber, and the chamber 100 may include, but is not limited to, a metal such as aluminum or stainless steel.

Referring to FIGS. 1 to 3, arranged in the chamber 100 are a shower head unit 600, a support unit 500, the first electrode 510, and the second electrode 610. The shower head unit 600 may include a body 611 and gas injection holes 612.

Above the support unit 500 and on the shower head unit 600, the first electrode 610 may be arranged. The first electrode 610 and the shower head unit 600 may be disposed in the chamber 100 on its upper side in the vertical direction (Z direction).

The first electrode 610 may be connected with the first power source 620. The first power source 620 may supply high-frequency power to the first electrode 610. The first power source 620 may apply the power to the first electrode 610 to establish plasma in the chamber 100.

The shower head unit 600 may include the body 611. The body 611 may include a plurality of gas injection boles 612 formed to penetrate the body 611 in the vertical (Z) direction.

Although not specifically illustrated, the body 611 may be configured to include a shower plate, a lower plate, and an upper plate.

The shower plate may directly inject into the inner space of the chamber 100 a process gas used to process a substrate W. For this purpose, the shower plate may be formed to have its bottom surface exposed to the inner space of the chamber 100.

The lower plate may be installed to be stacked on top of the shower plate. The lower plate may conform to the shower plate and may include a plurality of gas injection holes 612 penetrating in the vertical (Z) direction.

The upper plate may be stacked and installed on the lower plate. The upper plate may distribute and supply the process gas introduced from the outside to the plurality of gas injection holes 612 of the lower plate.

The gas injection holes 612 may supply a process gas into the chamber 100. Some embodiments may utilize a cleaning gas supplied into the chamber 100 through the gas injection holes 612 to clean the substrate W, the interior of the chamber 100, and others.

Each gas injection hole 612 may be formed to penetrate through the body 611 in the vertical (Z) direction. Multiples of such a gas injection hole 612 may be formed in the body 611.

On the support unit 500, the substrate W is seated to undergo a plasma process. The support unit 500 serves as a susceptor for supporting the substrate W. For example, the support unit 500 may include thereon an electrostatic chuck for holding the substrate W by an electrostatic attraction force.

The second electrode 510 may be arranged in the support unit 500. The second electrode 510 may be disposed in the chamber 100 and below the first electrode 610 in the vertical (Z) direction.

The support unit 500 may include the second electrode 510 under the electrostatic chuck. The second electrode 510 may be installed to be movable in the vertical (Z) direction by the driving unit 530. With the support unit 500 so formed to be movable in the vertical direction, the substrate W can be positioned in a region exhibiting a more uniform plasma distribution.

The second electrode 510 may be connected with the second power source 520. The second power source 520 supplies the chamber 100 with electric power for controlling the ion energy of the plasma. When the power is provided to the second electrode 510 of the support unit 500, a voltage may be induced in the substrate W disposed on the second electrode 510. The power controls the voltage of the substrate W, which may in turn control the ion energy of the plasma generated in the chamber 100.

RF source power may be provided to the first electrode 610 by the above-described first power source 620, and RF bias power may be provided to the second electrode 510 by the second power source 520.

A source voltage of a first magnitude may be provided to the first electrode 610 by the first power supply 620, and a bias voltage of a second magnitude may be provided to the second electrode 510 by the second power supply 520. In some embodiments, the second magnitude may be greater than the first magnitude. For example, the first magnitude may be 1500 W, and the second magnitude may be 2000 W. However, the technical idea of the present disclosure is not limited thereto.

According to some embodiments, to prevent contaminants such as copper (Cu) from being deposited on the shower head unit 600, the lower second electrode 510 may be provided with a voltage that is greater in magnitude than the voltage to be provided to the upper first electrode 610. This can prevent the body 611 and the gas injection holes 612 of the shower head unit 600 from being contaminated by the plasma-based cleaning process.

The support unit 500 may include a top ring 540 disposed around the substrate W to support the substrate W. Although not specifically illustrated, the ring 540 may include a focus ring and an edge ring surrounding the focus ring.

The ring 540 may include an insulating material. For example, the ring 540 may include, but is not limited to, ceramic, silicon carbide (SiC), or the like.

Although not specifically illustrated, the driving unit 530 may be connected to an exhaust unit installed in the lower portion of the chamber 100. The exhaust unit may include a vacuum pump such as a turbo molecular pump to adjust the internal processing space of the chamber 100 to a pressure of a desired degree of vacuum. Additionally, process by-products and residual process gases generated in the chamber 100 may be discharged through the exhaust unit.

The shield member 550 may be disposed on the sides of the support unit 500. The shield member 550 may serve to prevent electrical conduction between the chamber 100 and the support unit 500.

To this end, the shield member 550 may include an insulating material or a dielectric material. For example, the shield member 550 may include, but is not limited to, a ceramic material or a polymer material among others.

The gas supply unit 800 may include first to third gas supply units 810, 820, and 830 and first to third flow rate controllers 811, 821, and 831. The first to third gas supply units 810, 820, and 830 may supply various gases into the chamber 100 at its upper portion and/or side surfaces. For example, the first to third gas supply units 810, 820, and 830 may include a gas supply conduit passing through an upper wall of the chamber 100 and supplying a cleaning gas into the chamber 100. The first to third gas supply units 810, 820, and 830 may uniformly supply various gases into the plasma space in the chamber 100 at different regions of the substrate W.

The first to third gas supply units 810, 820, and 830 may supply different gases at a desired ratio. The first to third flow rate controllers 811, 821, and 831 may control supply flow rates of the gases introduced into the chamber 100 from the first to third gas supply units 810, 820, and 830. The first to third flow controllers 811, 821, and 831 may independently or collectively control the supply flow rates of the gases that are supplied from the first to third gas supply units 810, 820, and 830 into the chamber 100, respectively.

The first to third gas supply units 810, 820, and 830 may supply different cleaning gases into the chamber 100. The cleaning gases may include inert gases. For example, the cleaning gases may include Ar, $CF_4$, and $O_2$. In this case, the flow rate of Ar may be greater than the flow rate of $CF_4$ or the flow rate of $O_2$. For example, the flow rate of Ar may be 200 sccm, the flow rate of $CF_4$ may be 100 sccm, and the flow rate of $O_2$ may be 10 sccm. However, the technical idea of the present disclosure is not limited thereto.

Some embodiments may utilize $CF_4$ and $O_2$ as the cleaning gas and thereby chemically remove contaminants of the shower head unit 600. Additionally, some embodiments may utilize Ar as the cleaning gas and thereby remove contaminants of the shower head unit 600 more effectively through a physical method such as sputtering.

Although not specifically illustrated, the substrate processing apparatus 1000 may include a temperature control unit. The temperature control unit may include a heater and/or a cooler. For example, the temperature control unit may include a heater disposed inside the support unit 500 to control the temperature of the support unit 500 and a heater power supply unit for supplying power to the heater.

Figure 4:
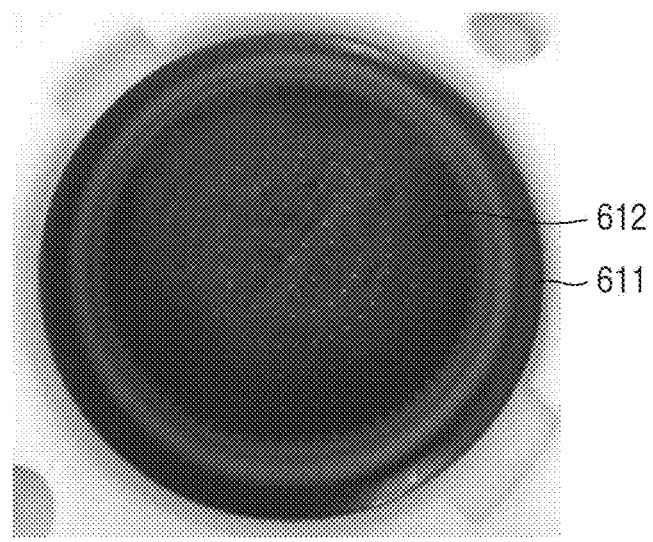
FIG. 4 is a view showing contaminants generated in a shower head unit of a substrate processing apparatus using a conventional substrate processing method.
Figure 5:
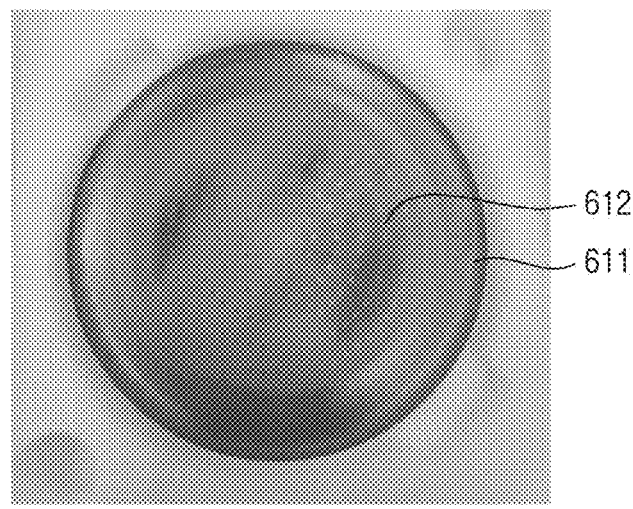
FIGS. 5 to 7 are views illustrating a reduced amount of contaminants compared to the related art, in the shower head unit of the substrate processing apparatus using the substrate processing method according to some embodiments of the present disclosure.
Figure 6:
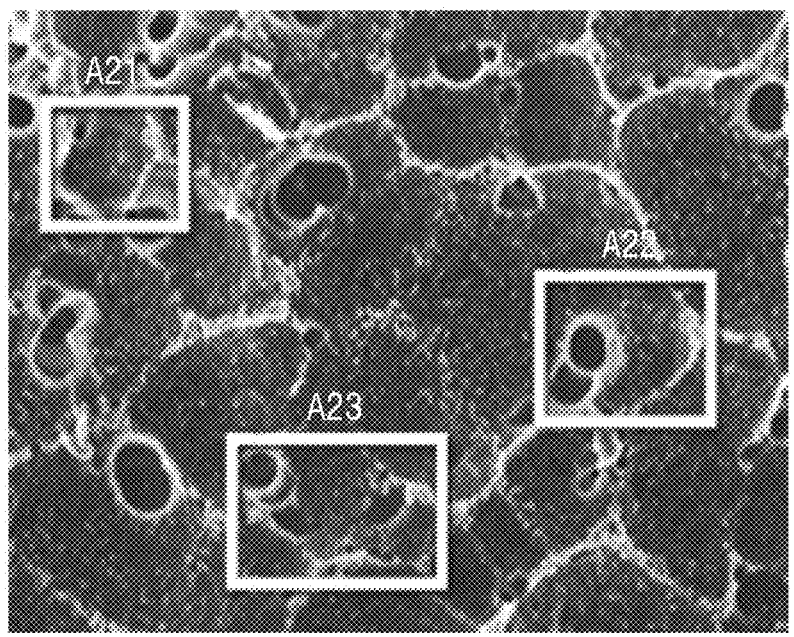
Figure 7:
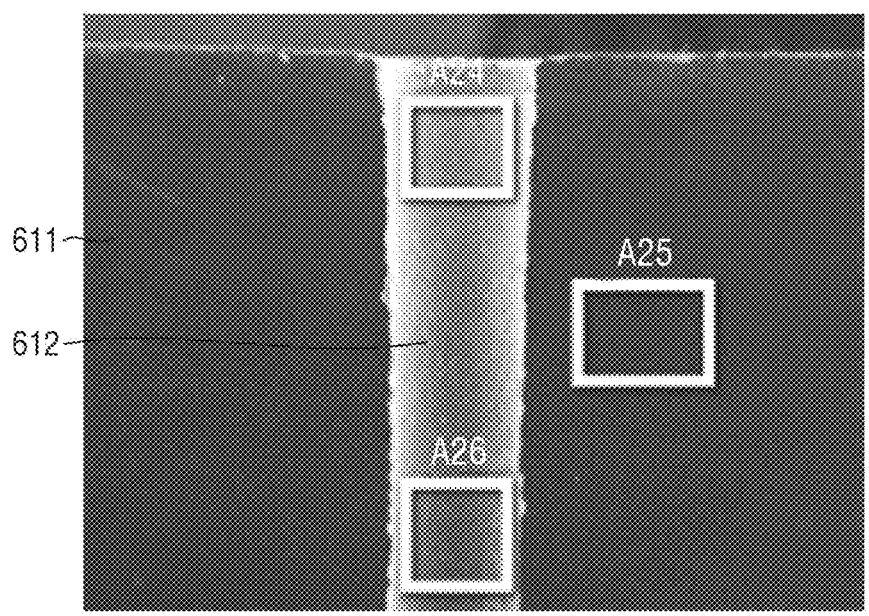

FIG. 4 is a view showing contaminants generated in the shower head unit 600 of a substrate processing apparatus using a conventional substrate processing method. FIGS. 5 to 7 are views illustrating a reduced amount of contaminants compared to the related art, in the shower head unit 600 of the substrate processing apparatus using the substrate processing method according to some embodiments of the present disclosure. FIGS. 6 and 7 are enlarged views showing contaminants of the shower head unit 600 by area by using SEM and EDAX analysis.

Referring to FIG. 4, it can be seen that contaminants such as copper (Cu) are deposited in the body 611 and the gas injection holes 612 of the shower head unit 600 during the conventional plasma process.

On the other hand. FIG. 5 shows a reduced deposition of contaminants such as copper (Cu) in the body 611 and the gas injection hole 612 of the shower head unit 600. Specifically, referring to FIG. 6, it can be seen that contaminants such as copper (Cu) deposited in areas A21, A22, and A23 of the upper surface of the shower head unit 600 are reduced compared to the prior art. Further, referring to FIG. 7, compared to the prior art, reduced contamination such as copper (Cu) can be seen deposited in areas A24 and A26 of the gas injection hole 612 of the shower head unit 600 and a partial area A25 of the body 611.

For example, according to some embodiments, the plasma may be formed in the chamber 100 by subjecting the same to the pressure of 40 mT, supplying a cleaning gas to the shower head unit 600 with Ar set to the flow rate of 200 sccm. $CF_4$ set to the flow rate of 100 sccm, and $O_2$ set to the flow rate of 10 sccm, and by supplying the first electrode 610 with a voltage set to 1500 W and supplying the second electrode 510 with a voltage set to 2000 W. This can more effectively remove contaminants from the shower head unit 600.

Figure 8:
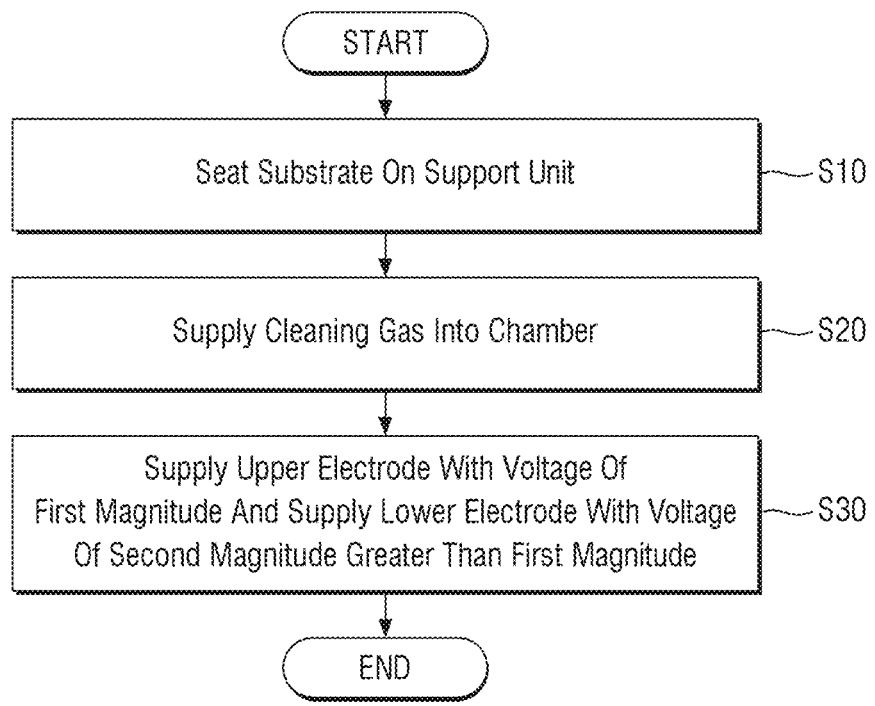
FIG. 8 is a flowchart of a substrate processing method according to some embodiments of the present disclosure.

FIG. 8 is a flowchart of a substrate processing method according to some embodiments of the present disclosure.

The substrate processing method according to some embodiments may be performed by using the above-described substrate processing apparatus 1000. Accordingly, the above description of the substrate processing apparatus 1000 may be similarly applied to the substrate processing method as it utilizes the substrate processing apparatus 1000. For purposes of brevity, the following may simplify or omit redundant descriptions of those of the above-described substrate processing apparatus 1000.

First the substrate W is seated on the support unit 500 (S10). According to some embodiments, firstly seating the substrate W on the support unit 500 can reduce possible damage to the support unit 500. According to some embodiments, since the second electrode 510 is applied with a voltage greater in magnitude than that applied to the first electrode 610, the substrate W can be successfully seated first on the support unit 500 before performing the process of removing contaminants of the shower head unit 600.

Thereafter, a cleaning gas may be supplied to the inside of the chamber 100 (S20). According to some embodiments, Ar, $CF_4$, and $O_2$ may be used as the cleaning gas. Specifically, the cleaning gas may be supplied to the shower head unit 600 with Ar set to the flow rate of 200 sccm, $CF_4$ set to the flow rate of 100 sccm, and $O_2$ set to the flow rate of 10 sccm.

According to some embodiments, by using $CF_4$ and $O_2$ as the cleaning gas, contaminants of the shower head unit 600 may be removed through a chemical method. Further, according to some embodiments, by using Ar as the cleaning gas, contaminants of the shower head unit 600 may be more effectively removed through a physical method such as sputtering.

Thereafter, a voltage of a first magnitude is provided to the upper electrode, that is, the first electrode 610, and a voltage of a second magnitude greater than the first magnitude is provided to the lower electrode, that is, the second electrode 510, thereby establishing plasma (S30). For example, the first magnitude may be 1500 W, and the second magnitude may be 2000 W. However, the technical idea of the present disclosure is not limited thereto.

According to some embodiments, to prevent a contaminant such as copper (Cu) from being deposited on the shower head unit 600, the second electrode 510 may be supplied with a voltage set to be higher than the voltage applied to the first electrode 610. This can prevent the body 611 and the gas injection holes 612 of the shower head unit 600 from being contaminated by the plasma-based cleaning process.

While a few exemplary embodiments of the present disclosure have been described with reference to the accompanying drawings, those skilled in the art will readily appreciate that various changes in form and details may be made therein without departing from the technical idea and scope of the present disclosure as defined by the following claims. Therefore, it is to be understood that the foregoing is illustrative of the present disclosure in all respects and is not to be construed as limited to the specific exemplary embodiments disclosed.

The invention claimed is:

1. A method of processing a substrate by using a substrate processing apparatus including a chamber, a shower head unit for supplying a cleaning gas into the chamber, a first electrode disposed on an upper portion of the shower head unit, a support unit for supporting the substrate, and a second electrode disposed inside the support unit, the method comprising:
   supplying the cleaning gas into the chamber; and
   supplying a voltage of a first magnitude to the first electrode and supplying a voltage of a second magnitude greater than the first magnitude to the second electrode,
   wherein the cleaning gas comprises Ar, $CF_4$, and $O_2$,
   wherein the Ar has a flow rate greater than a flow rate of the $CF_4$ and a flow rate of the $O_2$, and
   wherein the shower head unit has a body and a plurality of gas injection holes formed to penetrate the body, the first electrode is disposed inside the chamber, and the plurality of gas injection holes of the shower head unit are not formed above the first electrode and are formed between the first electrode and the second electrode.

2. The method of claim 1, further comprising:
   before the supplying of the cleaning gas into the chamber, seating the substrate on the support unit.

3. The method of claim 1, further comprising:
   providing a source power to the first electrode; and
   providing a bias power to the second electrode.

4. A method of processing a substrate by using a substrate processing apparatus including a chamber, a shower head unit for supplying a cleaning gas into the chamber, a first electrode disposed on an upper portion of the shower head unit, a support unit for supporting the substrate, and a second electrode disposed inside the support unit, the method comprising:
supplying the cleaning gas into the chamber; and
supplying a voltage of a first magnitude to the first electrode and supplying a voltage of a second magnitude greater than the first magnitude to the second electrode,
wherein the shower head unit has a body and a plurality of gas injection holes formed to penetrate the body, the first electrode is disposed inside the chamber, and the plurality of gas injection holes of the shower head unit are not formed above the first electrode and are formed between the first electrode and the second electrode.

\* \* \* \* \*